(12) United States Patent
Wang et al.

(10) Patent No.: US 9,397,056 B2
(45) Date of Patent: Jul. 19, 2016

(54) SEMICONDUCTOR DEVICE HAVING TRENCH ADJACENT TO RECEIVING AREA AND METHOD OF FORMING THE SAME

(71) Applicant: TAIWAN SEMICONDUCTOR MANUFACTURING COMPANY LTD., Hsinchu (TW)

(72) Inventors: Yen-Ping Wang, Changhua County (TW); Chao-Wen Shih, Hsinchu County (TW); Yung-Ping Chiang, Hsinchu County (TW); Shih-Wei Liang, Taichung County (TW); Tsung-Yuan Yu, Taipei (TW); Hao-Yi Tsai, Hsinchu (TW); Mirng-Ji Lii, Hsinchu County (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/294,531

(22) Filed: Jun. 3, 2014

(65) Prior Publication Data
US 2015/0348923 A1    Dec. 3, 2015

(51) Int. Cl.
| H01L 23/485 | (2006.01) |
| --- | --- |
| H01L 21/768 | (2006.01) |
| H01L 23/528 | (2006.01) |
| H01L 23/00 | (2006.01) |
| H01L 23/31 | (2006.01) |
| H01L 23/532 | (2006.01) |
| H01L 23/538 | (2006.01) |
| H01L 23/525 | (2006.01) |

(52) U.S. Cl.
CPC ............ *H01L 24/05* (2013.01); *H01L 23/3114* (2013.01); *H01L 23/3171* (2013.01); *H01L 23/538* (2013.01); *H01L 23/5329* (2013.01); *H01L 23/525* (2013.01); *H01L 2924/3841* (2013.01)

(58) Field of Classification Search
CPC ........... H01L 2224/10126; H01L 2224/11849; H01L 23/3192; H01L 2224/0391; H01L 2224/11515; H01L 2224/05647; H01L 2224/81024; H01L 2224/0401; H01L 24/16; H01L 2224/94; H01L 2224/73204; H01L 2224/05548; H01L 2224/11334
USPC .......................... 257/528, 737, 738, 741, 769
See application file for complete search history.

(56) References Cited

U.S. PATENT DOCUMENTS

2012/0299167 A1* 11/2012 Chen et al. ..................... 257/668
2013/0113094 A1* 5/2013 Wu et al. ....................... 257/737

* cited by examiner

*Primary Examiner* — Evan Pert
*Assistant Examiner* — Changhyun Yi
(74) *Attorney, Agent, or Firm* — Chun-Ming Shih

(57) ABSTRACT

In some embodiments in accordance with the present disclosure, a semiconductor device including a semiconductor substrate is received. An interconnect structure is provided over the semiconductor substrate, and a passivation is provided over the interconnect structure. The passivation includes an opening such that a portion of the interconnect structure is exposed. Moreover, a dielectric is provided over the passivation, and a post-passivation interconnect (PPI) is provided over the dielectric. The PPI is configured to connect with the exposed portion of the interconnect structure through an opening in the dielectric. Furthermore, the PPI includes a receiving area for receiving a conductor, and a trench adjacent to the receiving area. In certain embodiments, the receiving area is defined by the trench.

20 Claims, 8 Drawing Sheets

SEMICONDUCTOR DEVICE HAVING TRENCH ADJACENT TO RECEIVING AREA AND METHOD OF FORMING THE SAME

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump is disposed on the surface of a semiconductor substrate. The bump is then treated to maintain its position on the semiconductor substrate.

In addition to Flip-chip packaging, wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films. Thereafter, bumps are disposed on the semiconductor wafer and are expected to maintain position at certain locations. Due to the miniature scale of modern integrated circuits, maintaining bump position has become a challenge. Bump bridging and/or shifting issues have been affecting the yield. As a result, there is a need to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
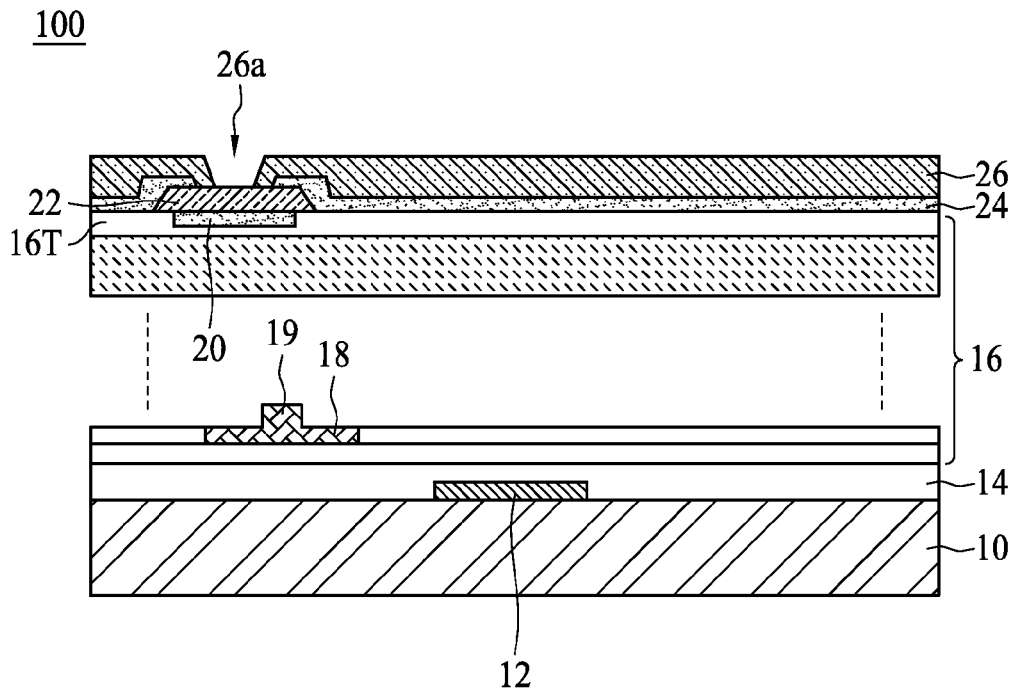
FIGS. 1-7 are cross-sectional views illustrating various intermediate stages of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, like reference numbers are used to designate like or similar elements throughout the various views, and illustrative embodiments of the present disclosure are shown and described. The figures are not necessarily drawn to scale, and in some instances the drawings have been exaggerated and/or simplified in places for illustrative purposes only. One of ordinary skill in the art will appreciate the many possible applications and variations of the present disclosure based on the following illustrative embodiments of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, substrate can refer either to the work piece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or an III-V material deposited upon a wafer. Work pieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain embodiments, the word "substrate" in the present disclosure represents a patterned substrate that has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric.

FIGS. 1-7 are cross-sectional views illustrating various intermediate stages of a method of forming a semiconductor device in accordance with some embodiments of the present disclosure.

Referring first to FIG. 1, in some embodiments in accordance with the present disclosure, a portion of a semiconductor substrate 10 of a semiconductor device 100 is provided. The semiconductor substrate 10 includes an electrical circuitry 12 formed thereon. The semiconductor substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

In some embodiments in accordance with the present disclosure, electrical circuitry 12 formed on the semiconductor substrate 10 may be any type of circuitry suitable for a particular application. In certain embodiments, the electrical circuitry 12 includes electrical devices formed on the semiconductor substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

In some embodiments in accordance with the present disclosure, an inter-layer dielectric (ILD) layer 14 is disposed over the semiconductor substrate 10 and the electrical circuitry 12. The ILD layer 14 may be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, or combinations thereof.

In some embodiments in accordance with the present disclosure, one or more inter-metal dielectric (IMD) layers 16 and the associated metallization layers are formed over the ILD layer 14. Generally, the one or more IMD layers 16 and the associated metallization layers (including metal lines 18, vias 19 and metal layer 20) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. It should be noted that one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In certain embodiments, etch stop layers may be formed of SiN, SiCN, SiCO, CN, combinations thereof, or the like, deposited by CVD or PECVD techniques.

In some embodiments in accordance with the present disclosure, the metallization layers, including metal lines 18 and vias 19, may be formed of copper or copper alloys, although they can also be formed of other metals. Furthermore, the metallization layers include a top metal layer 20 formed and patterned in or on the uppermost IMD layer 16T to provide external electrical connections and to protect the underlying layers from various environmental contaminants. The uppermost IMD layer 16T may be formed of a dielectric material, such as silicon nitride, silicon oxide, undoped silicon glass, and the like.

In some embodiments in accordance with the present disclosure, thereafter, a conductive pad 22 is formed over and is in contact with the top metal layer 20. Alternatively, the conductive pad 22 is electrically coupled to the top metal layer 20 through a via (not depicted). In certain embodiments, the conductive pad 22 is formed of aluminum, aluminum copper, aluminum alloys, copper, copper alloys, or the like.

In some embodiments in accordance with the present disclosure, one or more passivation layers, such as passivation layer 24, are formed over the conductive pad 22 and the uppermost IMD layer 16T. In addition, the passivation layer 24 is patterned to expose a portion of the conductive pad 22 through an opening. In certain embodiments, the passivation layer 24 is patterned to cover the peripheral portion of the conductive pad 22 and to expose the central portion of the conductive pad 22. The patterning method of the passivation layer 24 may include masking, lithography, etching or combinations thereof. Moreover, the passivation layer 24 may be formed of a dielectric material, such as undoped silicate glass (USG), silicon nitride, silicon oxide, silicon oxynitride or a non-porous material by any suitable method, such as CVD, PVD, or the like. In certain embodiments, the passivation layer 24 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

In some embodiments in accordance with the present disclosure, a dielectric 26 is formed on the passivation layer 24. The dielectric 26 is then patterned to form an opening 26a, through which at least a portion of the conductive pad 22 is exposed again. The dielectric 26 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods. In some embodiments, the dielectric 26 is an optional layer, which can be skipped in the semiconductor device.

In subsequent drawings, semiconductor substrate 10, electrical circuitry 12, ILD layer 14, IMD layers 16, and metallization layers 18 and 19 may not be illustrated for simplicity. In addition, the top metal layer 20 is formed as a part of the IMD layer 16.

Figure 2:
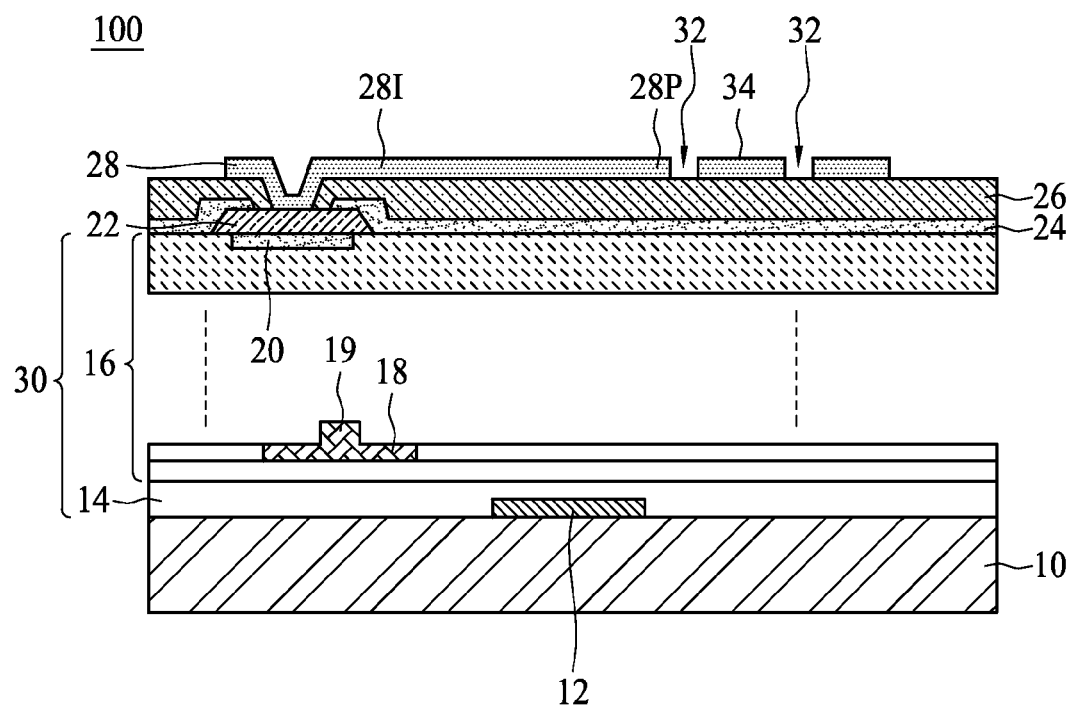

With reference to FIG. 2, in some embodiments in accordance with the present disclosure, a post-passivation interconnect (PPI) 28 having an upper surface is formed over the dielectric 26. In certain embodiments, the PPI 28 is configured to line the sidewalls and bottom of the opening 26a. In some embodiments, the PPI 28 is configured to fill the opening 26a. Accordingly, the PPI 28 is electrically connected with the conductive pad 22. The PPI 28 is an interconnect layer that includes an interconnect line region 28I adjacent to the conductive pad 22 and a landing pad region 28P away from the interconnect line region 28I. The interconnect line region 28I and the landing pad region 28P may be formed simultaneously, and may be formed of a same conductive material. In certain embodiments, the interconnect line region 28I extends to electrically connect the conductive pad 22 through the opening 26a, and a conductor feature will be formed over and electrically connected to the landing pad region 28P in subsequent processes. The PPI 28 may include, but is not limited to, for example copper, aluminum, copper alloy, or other mobile conductive materials using plating, electroless plating, sputtering, chemical vapor deposition methods, and the like. In some embodiments, the PPI 28 may further include a nickel-containing layer (not shown) on top of a copper-containing layer. In certain embodiments, the PPI 28 may also function as power lines, re-distribution lines (RDL), inductors, capacitors or any passive components. Through the routing of PPI 28, the landing pad region 28P may be, or may not be, directly over the conductive pad 22.

In some embodiments in accordance with the present disclosure, the electrical circuitry 12, ILD layer 14, IMD layers 16, the metallization layers 18 and 19, the top metal layer 20 and the conductive pad 22 are considered as an interconnect structure 30, as depicted in FIG. 2. In certain embodiments, the electrical circuitry 12, ILD layer 14, IMD layers 16, the metallization layers 18 and 19, the top metal layer 20, the conductive pad 22, the passivation layer 24 and/or the dielectric 26 are considered as a interconnect structure. Through the design and patterns at the interconnect structure 30, elements at the semiconductor device 100 may form an electrical connection with any device external to the semiconductor device 100.

With reference to FIG. 2, in some embodiments in accordance with the present disclosure, a trench 32 is patterned at the PPI 28. The patterning method of the PPI 28 may include masking, lithography, etching, laser scribing, or other suitable semiconductor manufacturing method. The trench 32 may or may not be patterned simultaneously with the formation of the PPI 28. In certain embodiments, the trench 32 is formed within the landing pad region 28P and thus defines a receiving area 34 within the landing pad region 28P. Over the receiving area 34, a conductor will be disposed thereon. In some embodiments, the upper surface of the PPI 28 in proximity with the receiving area 34 is substantially flat. In other words, the trench 32 is formed adjacent to a substantially flat receiving area 34 of the PPI 28. As such, when a treating agent or a device is placed over the receiving area 34, the trench 32 serves to keep a distance between the treating agent or the device and the PPI 28 external to the receiving area 34. Thereafter, during an additional positioning process, such as wetting or reflowing, there is a less likelihood that the treating agent or the device will react or interact with the PPI 28 external to trench 32 and the receiving area 34.

In some embodiments in accordance with the present disclosure, an island-like receiving area 34 is formed at the surface of the PPI 28 so as to accommodate the conductor to be formed in subsequent processes. In certain embodiments, the trench 32 is substantially c-shaped so as to at least partially surround the island-like receiving area 34. Thereafter, after an additional positioning process, such as wetting or reflowing, the conductor is maintained at a predetermined position, such as the central portion of the receiving area 34 defined by the trench 32. It should be noted that the location of the trench 32 is provided for illustrative purposes only and that the specific locations and patterns of the trench 32 may vary and may include, for example, an array, a line, a staggered pattern or the like. The illustrated trench 32 sizes are provided for reference only and are not intended to be actual sizes or actual relative sizes.

In some embodiments in accordance with the present disclosure, the PPI 28 includes more than one trench 32. The trenches 32 are disposed at opposite sides of the receiving area 34. It is to be noted that the number and positions of the multiple trenches is not so limited. Trenches of other numbers and positions are within the contemplated scope of the present disclosure.

Figure 3A:
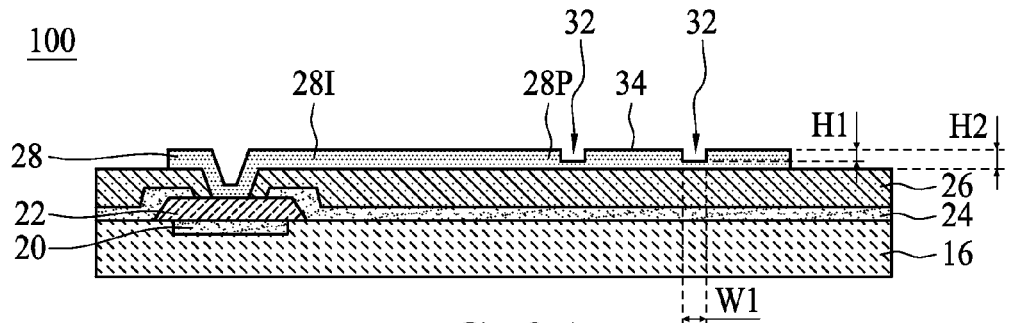

With reference to FIG. 3A, in some embodiments in accordance with the present disclosure, the trench 32 formed in the PPI 28 does not penetrate through the PPI 28. Accordingly, the dielectric 26 is not exposed by the trench 32. In other words, the depth H1 of the trench 32 is less than the thickness H2 of the PPI 28. The depth H1 is measured from the bottom of the trench 32 to the upper surface of the PPI 28, and the thickness is measured from the upper surface to the lower surface of the PPI 28.

In some embodiments in accordance with the present disclosure, the width W1 of the trench 32 is between about 10 μm and about 40 μm. The width W1 is measured from one wall of the trench to an opposite wall of the trench. In certain embodiments, the width W1 of the trench 32 is dependent on the dimension of the conductor to be disposed over the receiving area 34. Generally, the smaller the dimension of the conductor to be disposed, the smaller the width W1 of the trench 32 will be. In some embodiments, there are more than one trenches 32 in the PPI 28 and the width of the more than one trenches 32 are different so as to satisfy a predetermined requirement of the semiconductor device 100 and/or the connecting external devices.

Figure 3B:
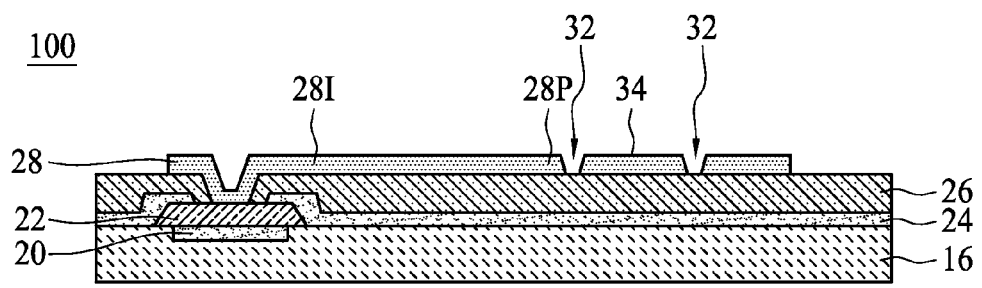

With reference to FIG. 3B, in some embodiments in accordance with the present disclosure, the wall of the trench 32 is not perpendicular to the upper surface of the PPI 28. That is, the wall of the trench 32 is angled such that the trench 32 has an inlet wider in dimension than its bottom, as depicted in FIG. 3B. Thereafter, a conductor is to be placed on top of the receiving area 34, and the wider inlet of the trench 32 serves to keep a larger distance between the conductor and the PPI 28 external to the receiving area 34. It is to be noted that the configuration of the trench 32 is not so limited. Trenches of other numbers and configurations are within the contemplated scope of the present disclosure.

Figure 4:
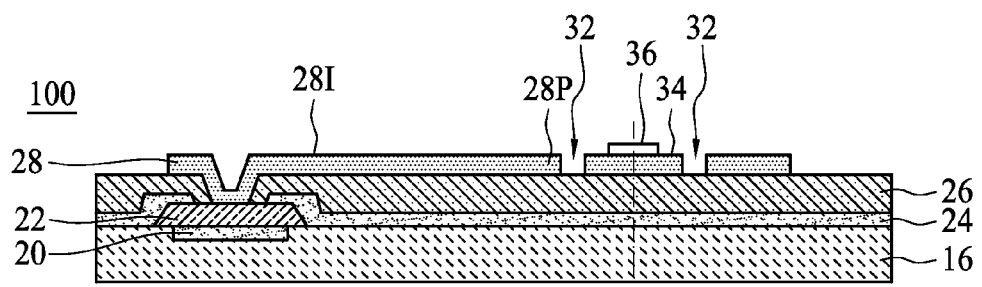

With reference to FIG. 4, in some embodiments in accordance with the present disclosure, a flux 36 is provided over the receiving area 34. The flux 36 is configured to be disposed around a central portion of the receiving area 34, which is defined by a central line C. Thereafter, a conductor is disposed over the flux 36 and the PPI 28 such that the flux 36 becomes an intermediate between the PPI 28 and the conductor. In certain embodiments, the flux 36 will interact with the PPI 28 and the conductor as an agent and decompose after a reflowing or wetting process. In other words, the flux 36 serves to secure the bonding between the PPI 28 and the conductor in certain processes so as to increase the yield of the semiconductor device final product. In some embodiments, the flux 36 is introduced to the PPI 28 at room temperature.

Figure 5:
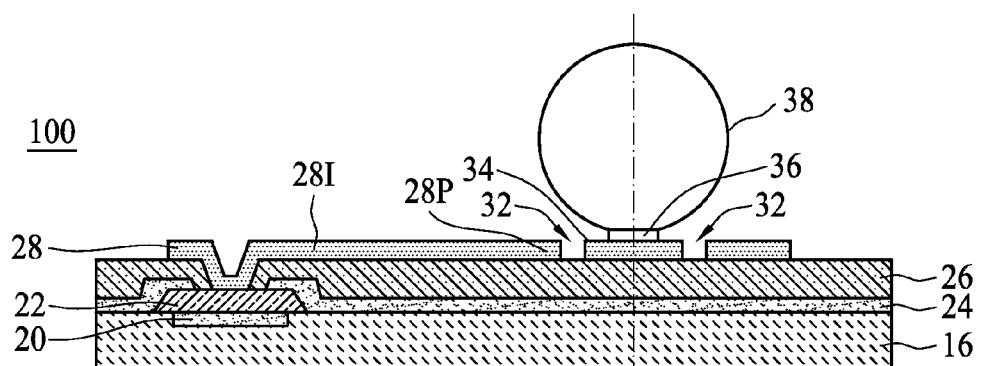

With reference to FIG. 5, in some embodiments in accordance with the present disclosure, a conductor 38 is disposed over the receiving area 34 and substantially aligned with the central line C of the receiving area 34. As such, the conductor 38 is substantially aligned with the flux 36, awaiting further conductor reflowing or wetting treatment. In certain embodiments, the flux 36 includes a material suitable for dissolving or removing the oxides present on the conductor 38. As such, when the semiconductor device 100 is brought to the reflow/wetting temperature, i.e., a temperature sufficient to melt the conductor and allow the conductor to wet the surface of the PPI 28 in contact, the conductor 38 is coalesced with the PPI 28 and maintained at around the central portion of the receiving area 34. After the foregoing treatment, the flux 36 will decompose such that no or only a limited amount of flux 36 could be found in the final product of the semiconductor device 100.

In some embodiments in accordance with the present disclosure, the conductor 38 is a solder, a bump or a pillar, depending on the nature of the semiconductor device 100. In some embodiments, the conductor 38 is formed by disposing a solder ball to the PPI 28 and then thermally reflowing the solder ball. In some embodiments, the conductor 38 includes a lead-free pre-solder layer, SnAg, or a solder material including alloys of tin, lead, silver, copper, nickel, bismuth, or combinations thereof. In some embodiments, the conductor 38 is formed by plating a solder layer with photolithography technologies followed by reflowing processes. In some embodiments, the conductor 38 includes "micro-bumps". In certain embodiments, the conductor 38 is made of a magnetic or ferromagnetic material.

Figure 6:
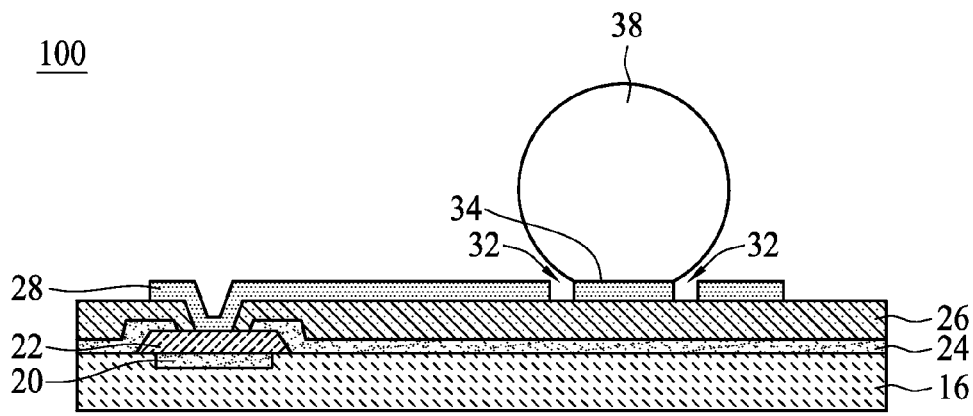

With reference to FIG. 6, in some embodiments in accordance with the present disclosure, after a reflowing/wetting treatment, the flux 36 is decomposed. Although there might be some residue of the flux 36 between the PPI 28 and the conductor 38, it is generally considered that the conductor 38 is now in direct contact with the receiving area 34 of the PPI 28. Accordingly, the conductor 38 is now in electrical connection with the semiconductor substrate through the PPI 28 and the interconnect structure there-under. In addition, the contacting interface between the conductor 38 and the PPI 28 is confined to the receiving area 34 due to the introduction of the trench 32 at the PPI 28. That is, the portion of the conductor 38 in contact with the PPI 28 does not extend outside the receiving area 34 and into or over the trench 32. Without such trench 32, during the reflowing/wetting process, the conductor 38 might expand (due to heat and/or interaction with the flux) and eventually become in contact with the PPI 28 external to the receiving area 34. As a result, the conductor 38 may not be properly aligned with the central portion of the receiving area 34 and a conductor shift issue might arise. Moreover, due to the shifting of the conductor 38, the height of the reflowed/wetted conductor might change, e.g., be lowered. Such difference of the height of the conductor 38 may cause issues such as conductor crack in subsequent processes or in final products of the semiconductor device 100. In certain embodiments, through the introduction of the trench 32 adjacent to the receiving area 34, the movement of the conductor 38 is limited. As such, the conductor 38 may be more accurately maintained at predetermined position, e.g., the central portion of the receiving area and/or the height of each conductor 38 disposed at the PPI 28 may be more consistent. Accordingly, in packaging assembly processes, issues such as conductor shift and uneven distribution of stress, which may lead to conductor crack, may be reduced.

In some embodiments in accordance with the present disclosure, when several conductors are disposed on the PPI 28, corresponding trenches may be introduced to maintain the plurality of conductors at their predetermined positions respectively. As such, the conductors will not move to positions other than the predetermined ones during the semiconductor manufacturing processes. Therefore, electrical connections between the semiconductor device 100 and external devices may be generated through predetermined routes or patterns. Moreover, the plurality of conductors will be separated from each other at their respective receiving area of the PPI 28 such that issues such as shortage or conductor cross talk may be reduced. In certain embodiments, a pitch between the conductors on the PPI 28 is between about 250 μm and about 500 μm. The pitch between conductors may be measured from the central point of one conductor to an adjacent conductor, or a right/left most point of one conductor to a right/left most point of an adjacent conductor.

Figure 7:
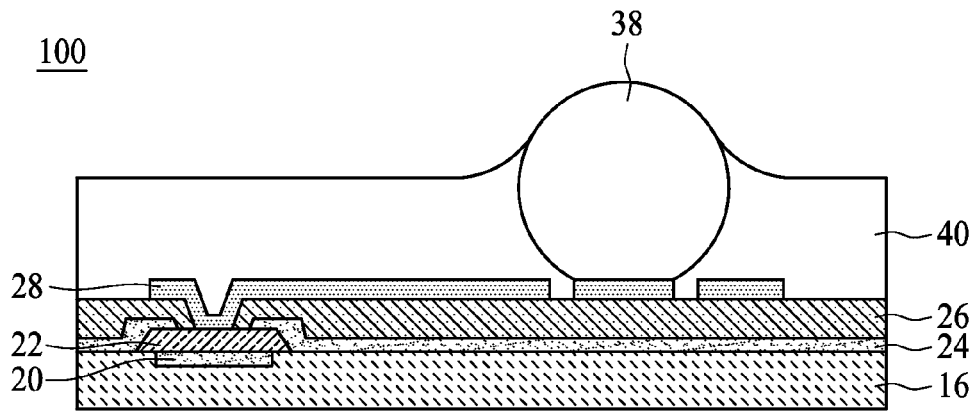

With reference to FIG. 7, in some embodiments in accordance with the present disclosure, after the conductor 38 formation, a protective layer 40 is introduced to the semiconductor device 100. The protective layer 40 is configured to cover the dielectric 26, PPI 28, and at least partially surround the conductor 38. In addition, the trench 32 is filled by the protective layer 40. In other words, after the introduction of the protective layer 40, the trench will not be exposed to any device or atmosphere external to the protective layer 40. Moreover, the introduction of the protective layer 40 ensures that the conductor 38 is retained at the predetermined position and further enhances the stability of the conductor 38. For example, the protective layer 40 serves to prevent the conductor 38 from shifting or shaking during the semiconductor manufacturing process. Thereafter, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

In some embodiments in accordance with the present disclosure, the protective layer 40 includes molding compound or encapsulant. In some embodiments, the protective layer 40 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Figure 8:
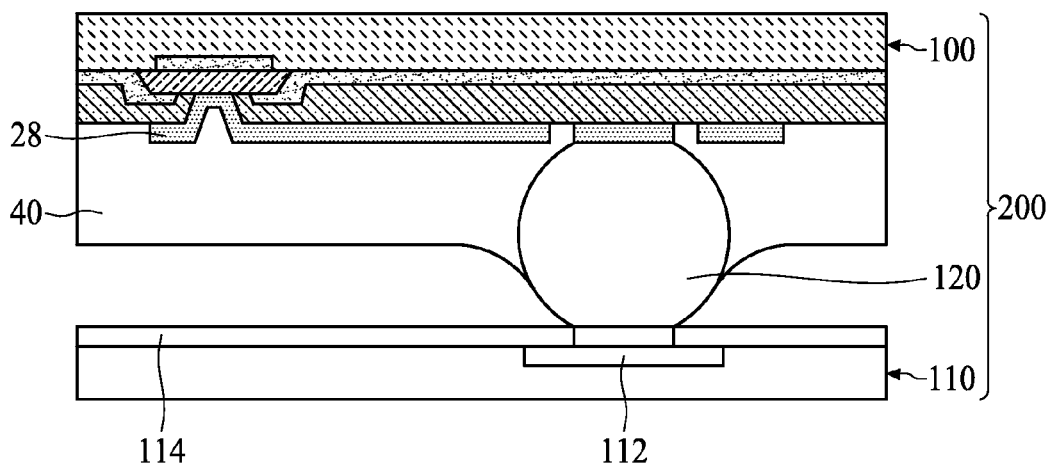
FIG. 8 is a cross-sectional view of a packaging assembly in accordance with some embodiments of the present disclosure.

FIG. 8 is a cross-sectional view of a packaging assembly in accordance with some embodiments of the present disclosure.

In some embodiments in accordance with the present disclosure, the structure shown in FIG. 7 is flipped upside down and attached to another substrate 110 at the bottom of FIG. 8. The substrate 110 may be a package substrate, board (e.g., a printed circuit board (PCB)), a wafer, a die, an interposer substrate, or other suitable substrate. The conductor structure is coupled to the substrate 110 through various conductive attachment points. For example, a conductive region 112 is formed and patterned on the substrate 110. The conductive region 112 is a contact pad or a portion of a conductive trace. In some embodiments, a mask layer 114, which is a solder resist layer, is formed and patterned on the substrate 110 to expose the conductive region 112. The mask layer 114 has a mask opening, which provides a window for solder joint formation. For example, a solder layer including alloys of tin, lead, silver, copper, nickel, bismuth, or combinations thereof may be provided on the conductive region 112. The semiconductor device 100 can be coupled to the substrate 110 to form a joint conductor structure 120 between the PPI 28 and the conductive region 112. An exemplary coupling process includes a flux application, chip placement, reflowing of melting solder joints, and/or cleaning of flux residue. The integrated semiconductor device 100, the joint conductor structure 120, and the substrate 110 may be referred to as a packaging assembly 200, or in the present embodiment, a flip-chip packaging assembly.

FIGS. 9-12 illustrate various top-views and corresponding cross-sectional views of a semiconductor device in accordance with some embodiments of the present disclosure. Unless specified otherwise, the reference numerals in these embodiments represent like elements in the embodiments illustrated in FIGS. 1-8.

Figure 9:
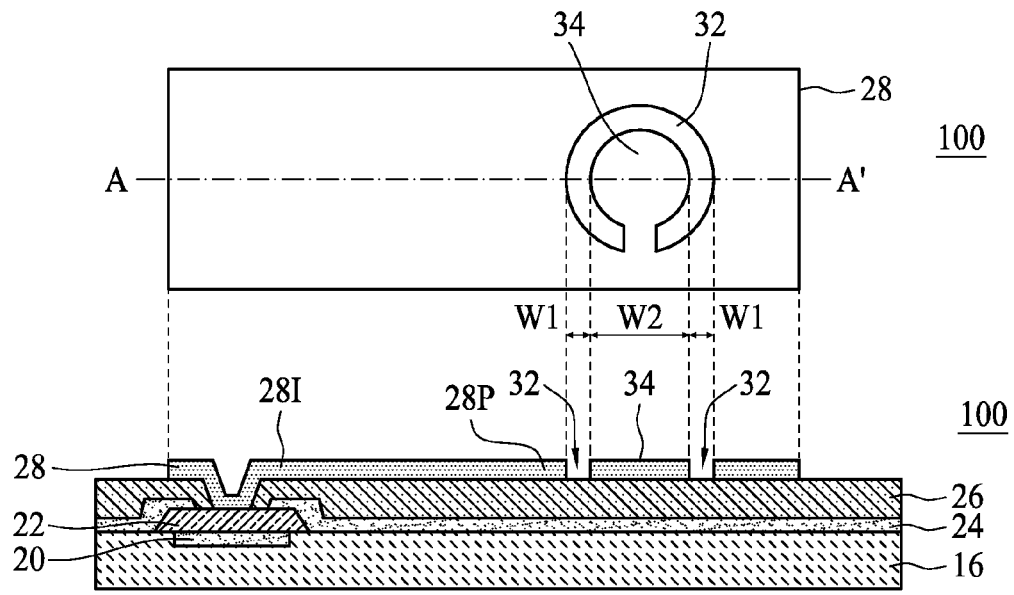
FIGS. 9-12 illustrate various top-views and corresponding cross-sectional views of a semiconductor device in accordance with some embodiments of the present disclosure.

With reference to FIG. 9, in some embodiments in accordance with the present disclosure, a top view of a PPI 28 including a trench 32 over an interconnect structure (not depicted) is provided. The trench 32 is at least partially surrounding the receiving area 34. In certain embodiments, as depicted in the upper portion of FIG. 9, the trench 32 is substantially c-shaped. That is, the electric connection between the receiving area 34 and the portions of the PPI 28 external to the trench 32 is maintained, and the receiving area 34 is not isolated from the rest of the PPI 28. As such, after the conductor is disposed over the receiving area 34, electric connection is established between the conductive pad 22 and the conductor. It is to be noted that the shape of the trench 32 is not so limited. The trench 32 may be of any shape as long as a distance is kept between the conductor and the PPI 28 external to the receiving area 34, and an electric connection is maintained between the conductor and the PPI 28 external to the receiving area 34.

In some embodiments in accordance with the present disclosure, the lower portion of FIG. 9 illustrates a cross-section view of the semiconductor structure from line A to A'. The width W1 of the trench 32 is between about 10 μm and about 40 μm. The width W1 is measured from one wall of the trench to an opposite wall of the trench. In certain embodiments, with reference to the upper portion of FIG. 9, the width W1 of the trench 32 is measured from an inner perimeter of the trench 32 to an outer perimeter of the trench 32. It is to be noted that the width of the trench 32 may be adjusted as long as a distance is kept between the conductor and the PPI 28 external to the receiving area 34 such that the conductor will not become in contact with the PPI 28 external to the receiving area 34 after the reflowing/wetting process.

In some embodiments in accordance with the present disclosure, a width W2 of the receiving area 34 is between about 120 μm and about 250 μm. The width W2 is measured from one inner perimeter of the trench 32 to an opposite inner perimeter of the trench 32. Referring to the upper portion of FIG. 9, in certain embodiments, the receiving area 34 is substantially round shaped and the width W2 is in fact the diameter of the receiving area 34.

Figure 10:
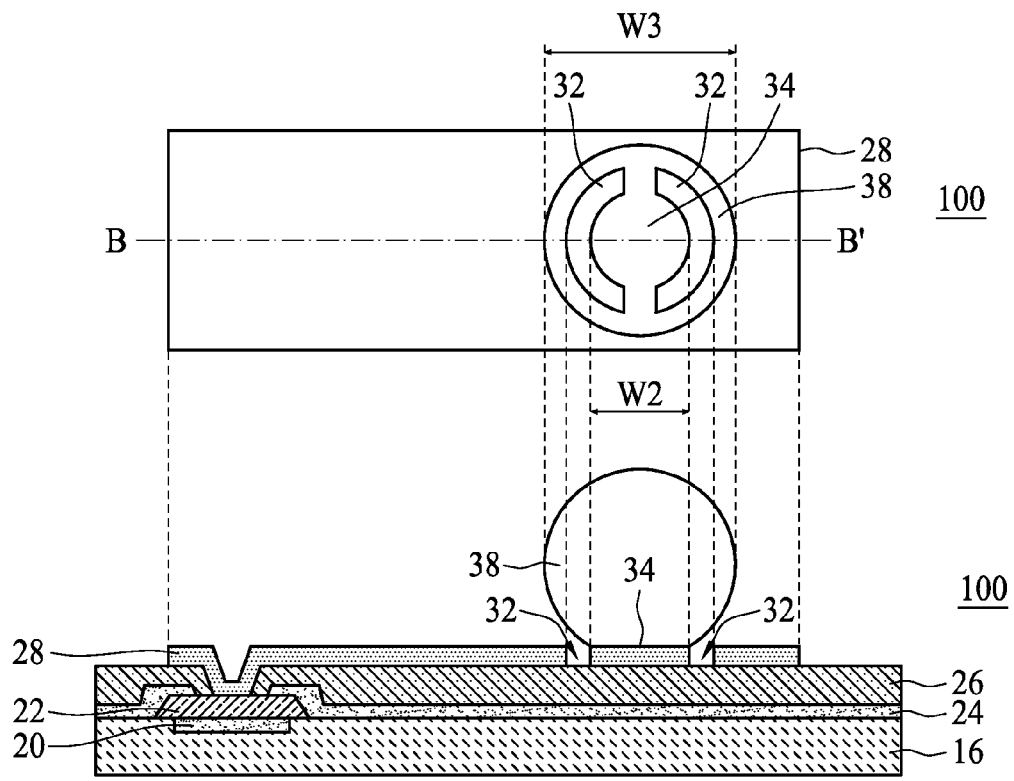

With reference to the upper portion of FIG. 10, in some embodiments in accordance with the present disclosure, a top view of a PPI 28 including more than one trenches 32 over an interconnect structure (not depicted) is provided. The conductor 38 in FIG. 10 is transparent such that the trenches 32 below can be demonstrated. The transparency of the conductor 38 may be changed in certain embodiments. The lower portion of FIG. 10 illustrates a cross-section view of the semiconductor structure from line B to B'. The trenches 32 serve to define the receiving area 34 within its perimeter. A conductor 38 is provided over the receiving area 34. Due to the reflowing/wetting treatment, the conductor 38 is now in direct contact with the PPI 28. In addition, with reference to the lower portion of FIG. 10, as the trenches 32 serve to separate the receiving area 34 from the PPI 28 external to the trenches 32, the conductor 38 is not in contact with the PPI 28 external to the trenches 32 and/or the receiving area 34. In other words, since the conductor 38 is substantially aligned with the central portion of the receiving area 34 and will not extend to the rest of the PPI 28 due to the separation by the trenches 32, the issue of conductor shift may be reduced.

In some embodiments in accordance with the present disclosure, a width W2 of the receiving area is smaller than the width W3 of the conductor 38. As illustrated in FIG. 10, the width W3 of the conductor 38 is measured from the left-most perimeter to the right-most perimeter of the conductor 38. In certain embodiments, the conductor 38 is ball shaped and the width W3 is essentially the diameter of the conductor 38. Although the conductor 38 disposed over the receiving area 34 is wider than the receiving area 34, due to the introduction of the trenches 32, a contacting interface between the conductor 38 and the PPI 28 will be confined to the receiving area 34. In other words, the conductor 38 will not extend over the trenches 32 and become in contact with the PPI 28 external to the receiving area 34. As such, the conductor 38 is maintained at a predetermined position, i.e., substantially aligned with a central portion of the receiving area 34, after the reflowing/wetting process. Consequently, issues such as conductor shift and uneven distribution of stress, which may lead to conductor crack, may be reduced.

Figure 11:
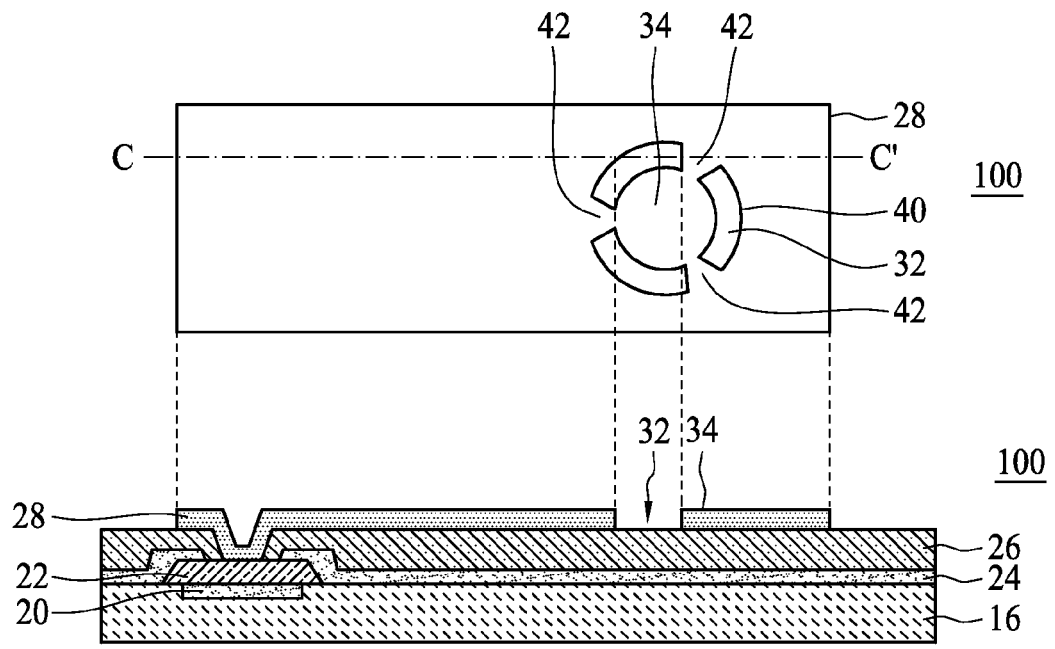

With reference to the upper portion of FIG. 11, in some embodiments in accordance with the present disclosure, a top view of a PPI 28 including three trenches 32 over an interconnect structure (not depicted) is provided. The lower portion of FIG. 11 illustrates a cross-section view of the semiconductor structure from line C to C'. The three trenches 32 serve to at least partially surround the receiving area 34, and yet electric connection between the receiving area 34 and the PPI 28 external to the three trenches 32 are maintained through some interconnections 42. In other words, the receiving area 34 is not completely separated from the rest of the PPI 28 by the three trenches 32. When a conductor is disposed over the PPI 28 and being reflowed/wetted, due to the separation of the three trenches 32, the conductor will not become in contact with the PPI 28 external to the receiving area 34. Therefore, the conductor is maintained at a predetermined position, e.g., substantially aligned with a central portion of the receiving area 34, after the reflowing/wetting process.

Figure 12:
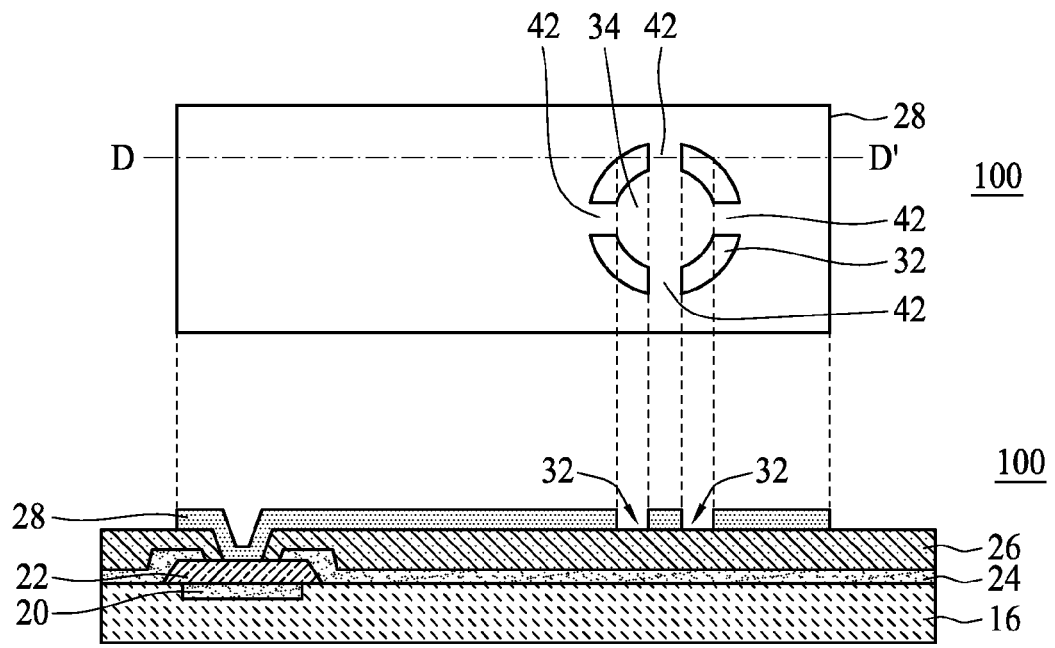

With reference to the upper portion of FIG. 12, in some embodiments in accordance with the present disclosure, a top view of a PPI 28 including four trenches 32 over an interconnect structure (not depicted) is provided. The lower portion of FIG. 12 illustrates a cross-section view of the semiconductor structure from line D to D'. The four trenches 32 serve to at least partially surround and accordingly define a receiving area 34. Between the adjacent trenches 32, interconnections 42 are preserved. Through such interconnections 42, electric connection between the receiving area 34 and the PPI 28 external to the trenches 32 are maintained. In certain embodiments, the interconnections 42 are not located symmetrically around the receiving area 34. In other words, the trenches 32 may not be located symmetrically around the receiving area 34. However, the location and configuration of the trenches 32 and interconnections 42 are not so limited. As long as a distance is kept between the receiving area 34 and the PPI 28 external to the trenches 32, the conductor disposed thereon will not become in contact with the PPI 28 external to the receiving area 34 after being reflowed/wetted. As previously disclosed, the number and configuration of the trenches is not so limited. Trenches of other numbers and configurations are within the contemplated scope of the present disclosure.

It should be noted that the position of the trench(s) 32 in FIGS. 9-12 is provided for illustrative purposes only and that the specific positions and patterns of the trench(s) 32 may vary and may include, for example, an array, a line, a staggered pattern or the like. In addition, the illustrated trench(s) 32 sizes are provided for reference only and are not intended to be actual sizes or actual relative sizes.

FIGS. 13-17 illustrate various partial top-views of a semiconductor device in accordance with some embodiments of the present disclosure. Unless specified otherwise, the reference numerals in these embodiments represent like elements in the embodiments illustrated in FIGS. 1-12.

Figure 13:
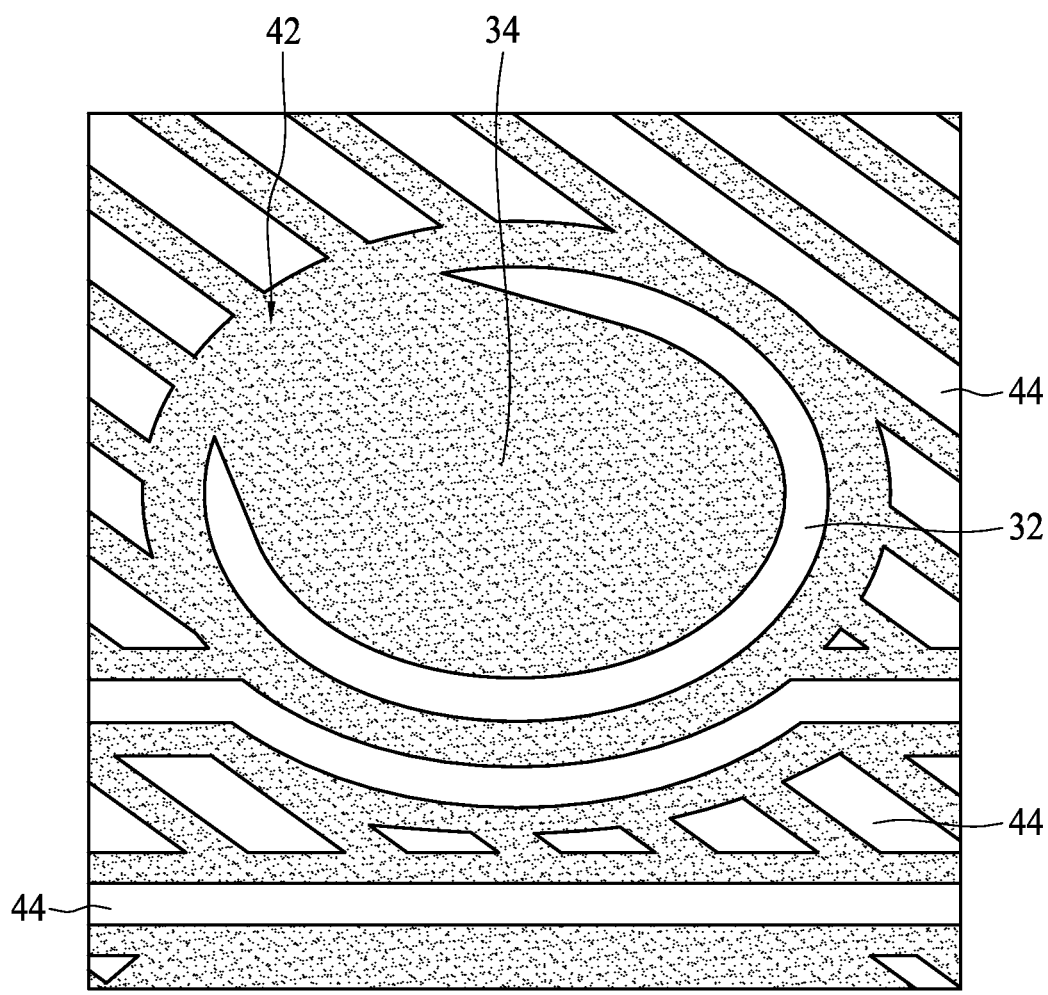
FIGS. 13-17 illustrate various partial top-views of a semiconductor device in accordance with some embodiments of the present disclosure.

With reference to FIG. 13, in some embodiments in accordance with the present disclosure, a top view of a PPI 28 including a trench 32 over an interconnect structure (not depicted) is provided. The trench 32 is configured to surround the receiving area 34, leaving an interconnection 42 such that electric connection between the receiving area 34 and the PPI 28 external to the trench 32 is maintained. Thereafter, a flux is to be provided at around a central area of the receiving area 34 and a conductor is to be disposed thereon. The trench 32 serves to ensure that the conductor won't extend to become in contact with the PPI 28 external to the trench 32. In certain embodiments, the PPI 28 external to the trench 32 is patterned, as illustrated in FIG. 13. Such patterns are configured to serve as different functions or structures according to the requirement of the underlying metal structure or the entire semiconductor device. For example, the patterns of the PPI 28 external to the trench 32 may function as power lines, re-distribution lines (RDL), inductors, capacitors or any passive components.

Figure 14:
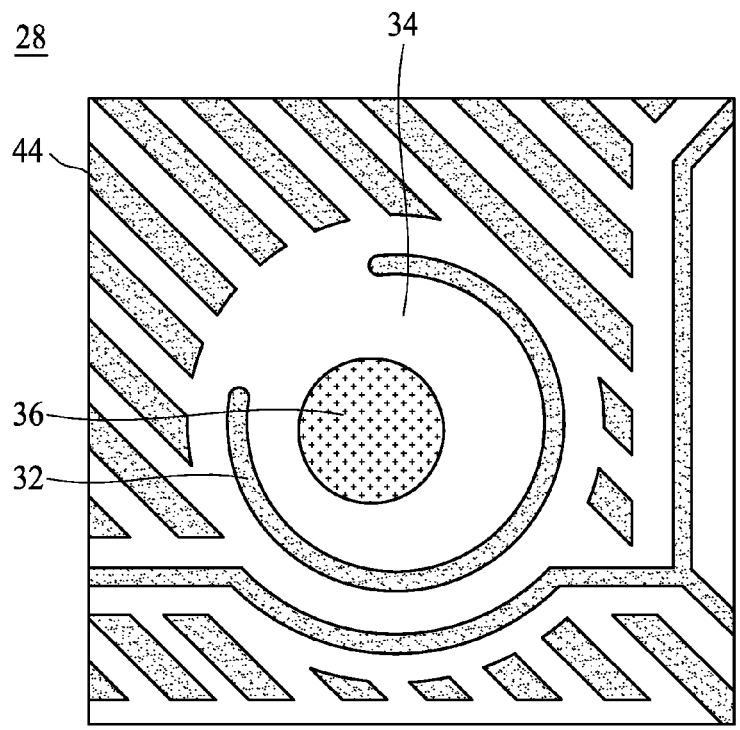
Figure 15:
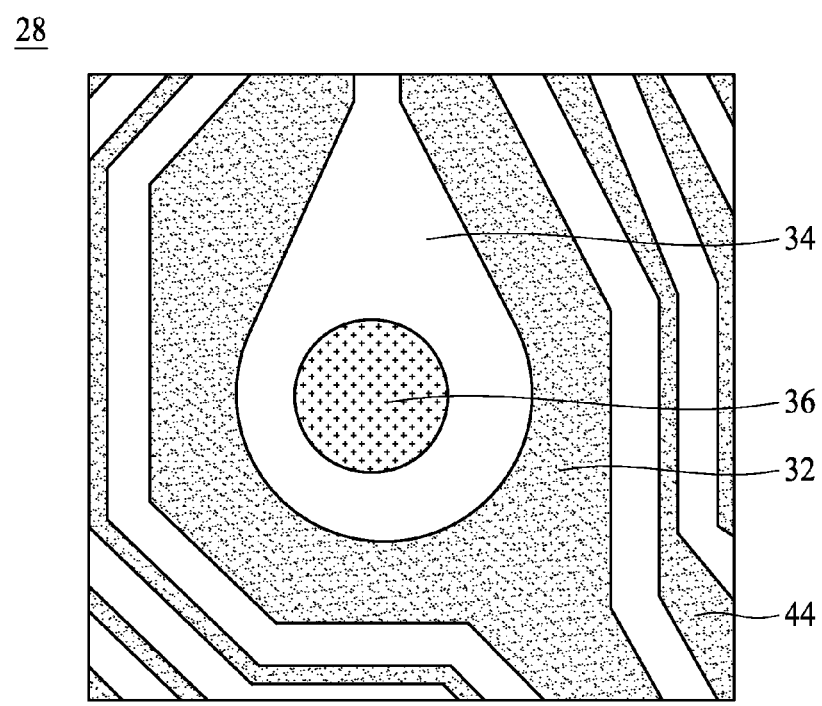
Figure 16:
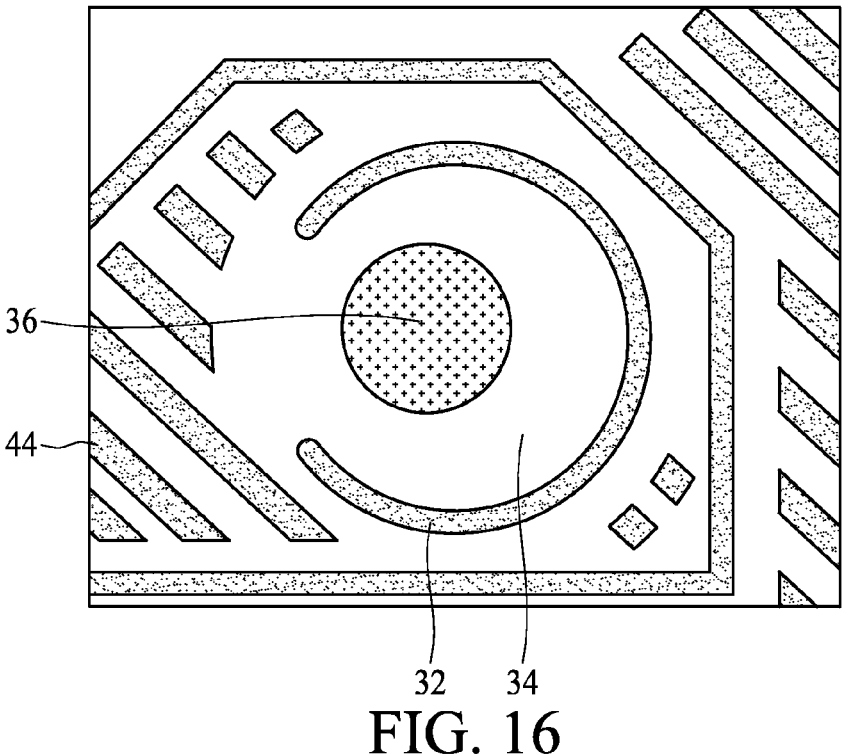
Figure 17:
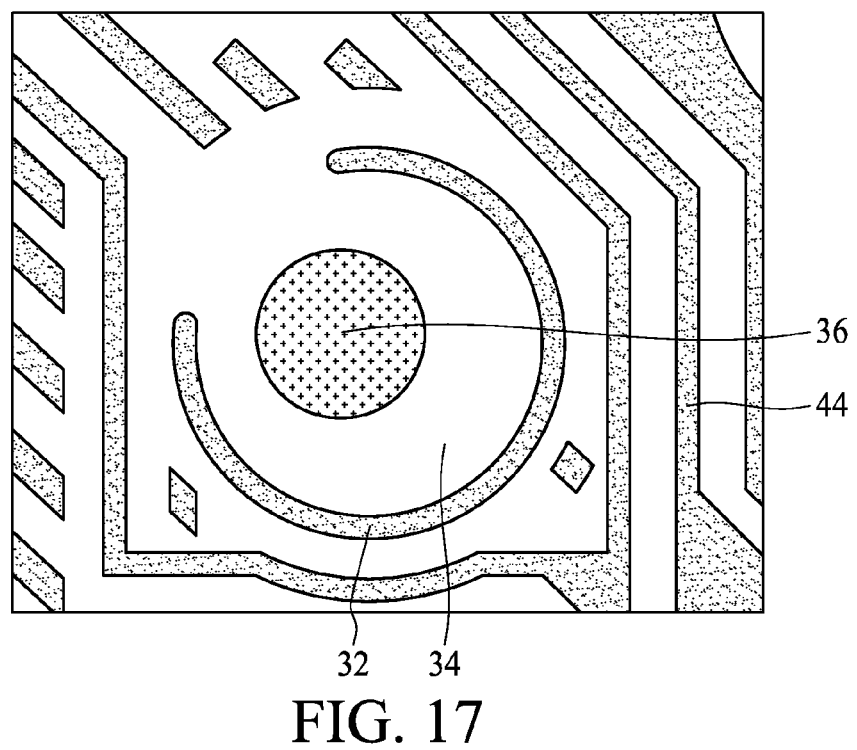

With reference to FIG. 14, in some embodiments in accordance with the present disclosure, four exemplary top views of PPI 28 including a trench 32 over an interconnect structure (not depicted) are provided. In each of the semiconductor structure, the trench 32 serves to surround and define the receiving area 34. The trench 32 may have diverse shape or configuration as long as a distance is kept between the receiving area and the PPI 28 external to the trench 32. In addition, the PPI 28 external to the trench 32 is patterned to have trenches 44 according to the requirement of the underlying metal structure or the entire semiconductor device. After the construction of the PPI 28 having the trench 32, a flux 36 is provided at around a central portion of the receiving area 34. Thereafter, a conductor is disposed over the flux and the receiving area 34, awaiting further treatments, such as reflowing or wetting. Because the trench 32 serves to keep a distance between the receiving area 34 and the PPI 28 external to the trench 32, the reflowed/wetted conductor is prevented from extending over the trench 32 and becoming in contact with the PPI 28 external to the trench 32. Accordingly, in packaging assembly processes, issues such as conductor shift and uneven distribution of stress, which may lead to conductor crack, may be reduced. In some embodiments in accordance with the present disclosure, PPI 28 of different pattern, configuration, shape and number of trench 32, receiving area 34 and trench 44 are illustrated in FIGS. 15-17.

In some embodiments in accordance with the present disclosure, a semiconductor device including an interconnect structure over a semiconductor substrate is provided. A passivation is provided over the interconnect structure. The passivation includes an opening for exposing a portion of the interconnect structure. A dielectric is then provided over the passivation. A post-passivation interconnect (PPI) is then provided over the dielectric, and the PPI is configured to connect with the exposed portion of the interconnect structure through an opening in the dielectric. The PPI includes a receiving area for receiving a conductor. Moreover, the PPI includes a trench adjacent to the receiving area.

In some embodiments in accordance with the present disclosure, a semiconductor device including an interconnect structure overlying a semiconductor substrate is provided. A passivation is provided over the interconnect structure, and a dielectric is proved over the passivation. Moreover, a post-passivation interconnect (PPI) is provided over the dielectric and configured to connect with the interconnect structure through an opening penetrating the passivation and the dielectric. A receiving are of the PPI is defined by a trench at least partially surrounding the receiving area. In addition, the receiving area is configured to receive a conductor.

In some embodiments in accordance with the present disclosure, a method for manufacturing semiconductor device is provided. In one operation, a semiconductor substrate is received. In one operation, a interconnect structure is provided over the semiconductor substrate. In one operation, a passivation is provided over the interconnect structure. In one operation, a portion of the interconnect structure is exposed through an opening configured at the passivation. In one operation, a dielectric is provided over the passivation. In one operation, part of the portion of the interconnect structure is exposed through an opening in the dielectric. In one operation, a post-passivation dielectric (PPI) including a trench is provided over the dielectric. In addition, the trench serves to The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   an interconnect structure over the semiconductor substrate,
   a passivation over the interconnect structure and comprising an opening to expose a portion of the interconnect structure;
   a dielectric over the passivation; and
   a post-passivation interconnect (PPI) over the dielectric, and the PPI configured to connect with the exposed portion of the interconnect structure through an opening in the dielectric, wherein the PPI comprises a receiving area configured to receive a conductor,
   wherein the PPI includes a trench adjacent to the receiving area, and the trench is within an area vertically viewed toward the PPI from an outmost perimeter of the conductor.

2. The semiconductor device according to claim 1, wherein the PPI includes more than one trenches adjacent to the receiving area.

3. The semiconductor device according to claim 2, wherein the more than one trenches are configured at opposite sides of the receiving area.

4. The semiconductor device according to claim 2, wherein a distance between the more than one trenches is less than a width of the conductor.

5. The semiconductor device according to claim 1, wherein the PPI includes an upper surface, and a portion of the upper surface in proximity with the receiving area is substantially flat.

6. The semiconductor device according to claim 1, further comprising:
   a molding compound over the PPI, the dielectric, the passivation and the interconnect structure, wherein the molding compound is configured to at least partially surround the conductor and secure the conductor at a predetermined position.

7. The semiconductor device according to claim 6, wherein the molding compound is configured to fill the trench.

8. The semiconductor device according to claim 1, wherein the conductor is configured to be aligned with a central point of the receiving area.

9. The semiconductor device according to claim 1, wherein the conductor is electrically connected with the semiconductor substrate through the PPI and the interconnect structure.

10. The semiconductor device according to claim 1, wherein a width of the trench is between about 10 μm and about 40 μm.

11. The semiconductor device according to claim 1, wherein a depth of the trench is less than a thickness of the PPI.

12. A semiconductor device, comprising:
    an interconnect structure overlying a semiconductor substrate;
    a passivation overlying the interconnect structure;
    a dielectric overlying the passivation; and
    a post-passivation interconnect (PPI) overlying the dielectric and configured to connect with the interconnect structure through an opening penetrating the passivation and the dielectric, wherein the a receiving area of the PPI is defined by a trench at least partially surrounding the receiving area, the receiving area is configured to receive a conductor, and the trench is within an area vertically viewed toward the PPI from an outmost perimeter of the conductor.

13. The semiconductor device according to claim 12, wherein a width of the receiving area is smaller than a width of the conductor.

14. The semiconductor device according to claim 12, wherein the trench includes an inner perimeter and an outer perimeter, wherein a distance from the inner perimeter to the outer perimeter is between about 10 μm and about 40 μm.

15. The semiconductor device according to claim 12, further comprising:
    more than one trenches at the PPI, wherein the more than one trenches are configured to at least partially surround the receiving area and allow electric connection between the conductor and the interconnect structure through the PPI.

16. The semiconductor device according to claim 12, wherein a width of the receiving area is between about 120 μm and about 250 μm.

17. The semiconductor device according to claim 12, wherein the trench is disposed with a molding compound.

18. A method for manufacturing semiconductor device, comprising:
    receiving a semiconductor substrate;
    providing a interconnect structure over the semiconductor substrate;
    providing a passivation over the interconnect structure;
    exposing a portion of the interconnect structure through an opening configured at the passivation;
    providing a dielectric over the passivation;
    exposing part of the portion of the interconnect structure through an opening in the dielectric;
    providing a post-passivation dielectric (PPI) including a trench over the dielectric, wherein the trench defines a receiving area at the PPI by at least partially surrounding the receiving area; and
    disposing a conductor over the receiving area, wherein the trench is within an area vertically viewed toward the PPI from an outmost perimeter of the conductor.

19. The method according to claim 18, further comprising:
    providing a flux at around a central portion of the receiving area; and
    treating the conductor such that a chemical reaction between the conductor, the flux and the PPI is limited to the receiving area of the PPI.

20. The method according to claim 19, further comprising:
    aligning the conductor with the central portion of the receiving area such that portion of the conductor in contact with the PPI does not extend outside the receiving area, into the trench or over the trench.

* * * * *